United States Patent
Kitamura et al.

(10) Patent No.: US 9,935,257 B2
(45) Date of Patent: Apr. 3, 2018

(54) PRODUCTION METHOD FOR COMPOSITE SUBSTRATE

(71) Applicant: NGK INSULATORS, LTD., Nagoya (JP)

(72) Inventors: Kazumasa Kitamura, Ichinomiya (JP); Tomoki Nagae, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 15/449,053

(22) Filed: Mar. 3, 2017

(65) Prior Publication Data

US 2017/0179371 A1 Jun. 22, 2017

Related U.S. Application Data

(63) Continuation of application No. PCT/JP2016/077032, filed on Sep. 14, 2016.

(30) Foreign Application Priority Data

Sep. 15, 2015 (JP) .................................. 2015-181762

(51) Int. Cl.
*B44C 1/22* (2006.01)
*H01L 41/337* (2013.01)
(Continued)

(52) U.S. Cl.
CPC ............ *H01L 41/337* (2013.01); *B24B 37/10* (2013.01); *B81C 1/00611* (2013.01); *H01L 21/30625* (2013.01); *H01L 21/7684* (2013.01)

(58) Field of Classification Search
CPC ............ B81C 1/00611; H01L 21/7684; H01L 21/30625; H01L 41/337; H01L 2224/03616; B24B 37/10; C09K 3/1454
(Continued)

(56) References Cited

U.S. PATENT DOCUMENTS

2003/0092363 A1* 5/2003 Laursen .................. B24B 37/26
451/41
2003/0168169 A1 9/2003 Ishikawa et al.
(Continued)

FOREIGN PATENT DOCUMENTS

JP 2001-118812 A1 4/2001
JP 2001-308049 A1 11/2001
(Continued)

OTHER PUBLICATIONS

English Translation of International Search Report, International Application No. PCT/JP2016/077032, dated Nov. 22, 2016 (2 pages).
(Continued)

*Primary Examiner* — Binh X Tran
(74) *Attorney, Agent, or Firm* — Burr & Brown, PLLC

(57) ABSTRACT

A production method for a composite substrate according to the present invention comprises
(a) a step of mirror-polishing a piezoelectric-substrate side of a laminated substrate formed by bonding a piezoelectric substrate and a support substrate;
(b) a step of performing machining using an ion beam or a neutral atom beam so that a thickness of an outer peripheral portion of the piezoelectric substrate is larger than a thickness of an inner peripheral portion and a difference between a largest thickness and a smallest thickness of the inner peripheral portion of the piezoelectric substrate is 100 nm or less over an entire surface; and
(c) a step of flattening the entire surface of the piezoelectric substrate to remove at least a part of an altered layer formed by the machining using the ion beam or the neutral atom beam in the step (b).

8 Claims, 7 Drawing Sheets

(51) Int. Cl.
*B24B 37/10* (2012.01)
*H01L 21/768* (2006.01)
*H01L 21/306* (2006.01)
*B81C 1/00* (2006.01)

(58) Field of Classification Search
USPC .......................... 216/38, 66, 89, 94; 438/692
See application file for complete search history.

(56) References Cited

U.S. PATENT DOCUMENTS

| | | | |
|---|---|---|---|
| 2014/0145558 A1* | 5/2014 | Hori ........................ | H03H 3/02 |
| | | | 310/313 R |
| 2014/0173862 A1* | 6/2014 | Kando .................. | H01L 41/257 |
| | | | 29/25.35 |
| 2015/0042207 A1 | 2/2015 | Hori et al. | |
| 2015/0280107 A1* | 10/2015 | Hori ........................ | H03H 3/08 |
| | | | 310/313 R |
| 2015/0328875 A1* | 11/2015 | Hattori .................... | B32B 38/10 |
| | | | 310/313 R |
| 2016/0001418 A1* | 1/2016 | Terada .................. | B24B 37/005 |
| | | | 451/36 |

FOREIGN PATENT DOCUMENTS

| | | |
|---|---|---|
| JP | 2015-145054 A1 | 8/2015 |
| WO | 2014/104098 A1 | 7/2014 |
| WO | 2014/156507 A1 | 10/2014 |

OTHER PUBLICATIONS

International Search Report and Written Opinion (Application No. PCT/JP2016/077032) dated Nov. 22, 2016.

* cited by examiner

FIG. 2B  ⇩ Step (a)

FIG. 2C  ⇩ Step (b)

FIG. 2D  ⇩ Step (c)

PRODUCTION METHOD FOR COMPOSITE SUBSTRATE

BACKGROUND OF THE INVENTION

1. Field of the Invention

The present invention relates to a production method for a composite substrate.

2. Description of the Related Art

It is expected to realize an unconventional elastic wave device operable at a high frequency by using a piezoelectric thin film having a considerably small thickness. Preferably, the piezoelectric thin film is a piezoelectric single crystal thin film having high crystallinity, an arbitrary crystal axis, and uniform thickness. As a method for obtaining such a piezoelectric thin film, for example, PTL 1 proposes that a piezoelectric-substrate side of a laminated substrate having a diameter of 4 inches or more and obtained by bonding a piezoelectric substrate and a support substrate is mirror-polished, data on a thickness distribution of the polished piezoelectric substrate is created, and ion beam machining is performed on the basis of the data on the thickness distribution.

CITATION LIST

Patent Literature

PTL 1: WO 2014/104098 A1

SUMMARY OF THE INVENTION

While an altered layer is sometimes formed on a surface of the piezoelectric substrate by ion beam machining, it is sometimes desirable to minimize such an altered layer. However, when polishing is performed to remove the altered layer, sagging occurs in an outer peripheral portion, and this reduces the thickness of the piezoelectric substrate. As a result, this portion cannot be used. For this reason, there has been a demand for a production method for a composite substrate which can minimize an altered layer and can suppress the occurrence of sagging.

The present invention has been made to solve such a problem, and a main object of the invention is to provide a production method for a composite substrate which can minimize an altered layer and can suppress the occurrence of sagging.

As a result of earnest study to solve the above problem, the present inventors arrived at an idea of performing machining using an ion beam or a neutral atom beam so that the thickness of a piezoelectric substrate is large in an outer peripheral portion and performing CMP while rotating and moving a polishing pad having a diameter smaller than that of the piezoelectric substrate with a constant pressing force. Also, the present inventors found that an altered layer of the piezoelectric substrate was minimized and the occurrence of sagging was suppressed in an obtained composite substrate, and achieved the present invention.

A production method for a composite substrate according to the present invention comprises (a) a step of mirror-polishing a piezoelectric-substrate side of a laminated substrate having a diameter of 2 inches or more and formed by bonding a piezoelectric substrate and a support substrate until a thickness of the piezoelectric substrate reaches 20 μm or less;

(b) a step of performing machining using an ion beam or a neutral atom beam so that a thickness of an outer peripheral portion of the piezoelectric substrate is larger than a thickness of an inner peripheral portion and a difference between a largest thickness and a smallest thickness of the inner peripheral portion of the piezoelectric substrate is 100 nm or less over an entire surface; and (c) a step of flattening the entire surface of the piezoelectric substrate to remove at least a part of an altered layer formed by the machining using the ion beam or the neutral atom beam in the step (b) by performing CMP using a polishing pad having a diameter of 5 mm or more and 30 mm or less and rotating and moving the polishing pad relative to the piezoelectric substrate while maintaining a constant pressing force of the polishing pad.

In the production method for the composite substrate according to the present invention, since at least a part of an altered layer formed by machining using an ion beam or a neutral atom beam is removed, it is possible to provide a composite substrate in which the altered layer is further reduced. At this time, CMP is conducted under proper conditions on the composite substrate that has been subjected to ion beam machining so that the thickness of the piezoelectric substrate is large in the outer peripheral portion. Hence, the occurrence of sagging due to CMP can be suppressed.

BRIEF DESCRIPTION OF THE DRAWINGS

FIGS. 2A to 2D show explanatory views of a production method for a composite substrate 20.

DETAILED DESCRIPTION OF THE INVENTION

Figure 1:
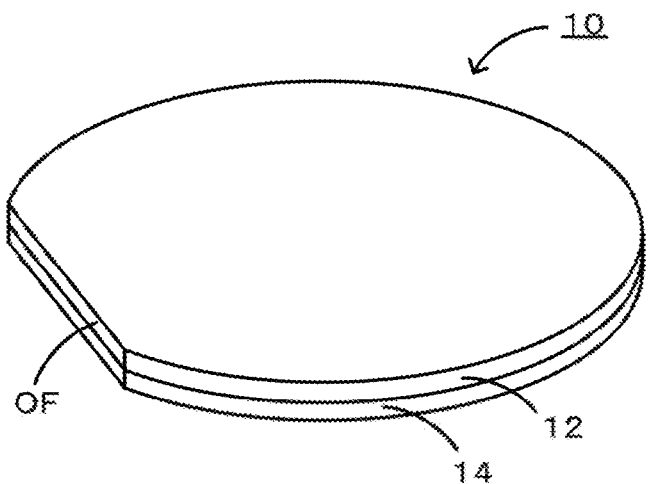
FIG. 1 is a perspective view of a laminated substrate 10.
Figure 3:
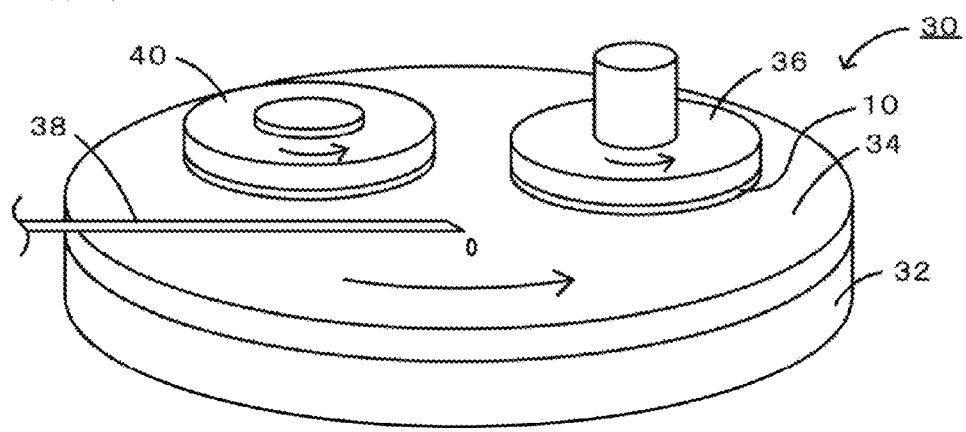
FIG. 3 is a perspective view of a polishing part in a typical CMP machine 30.
Figure 4:
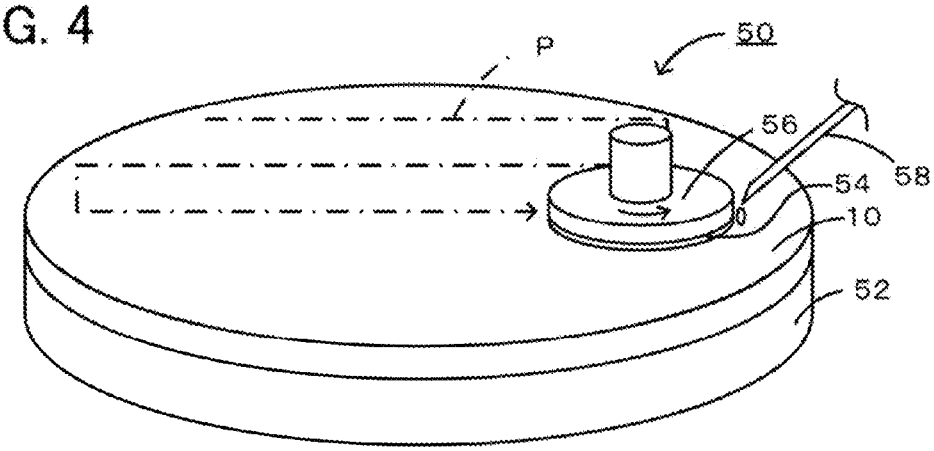
FIG. 4 is a perspective view of a polishing part in a small-diameter tool CMP machine 50.
Figure 5:
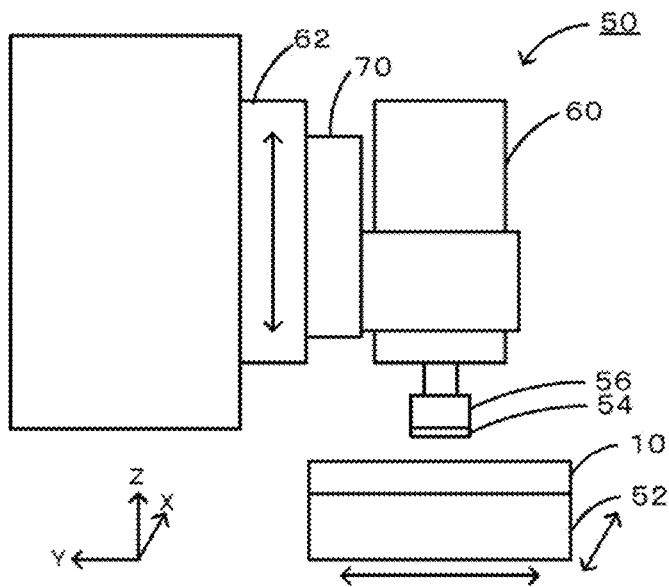
FIG. 5 is an explanatory view of the small-diameter tool CMP machine 50.

An embodiment of the present invention will be described below with reference to the drawings. A production method for a composite substrate according to the embodiment includes Steps (a) to (c) described below. FIG. 1 is a perspective view of a laminated substrate 10 used in the embodiment. FIGS. 2A to 2D include explanatory views of a production method for a composite substrate 20 according to the embodiment. FIG. 3 is a perspective view of a polishing part in a typical CMP machine 30 used in, for example, Step (a). FIG. 4 is a perspective view of a polishing part in a small-diameter tool CMP machine 50 used in, for example, Step (c), and FIG. 5 is an explanatory view of the small-diameter tool CMP machine 50.

1. Step (a)

Figure 2A:
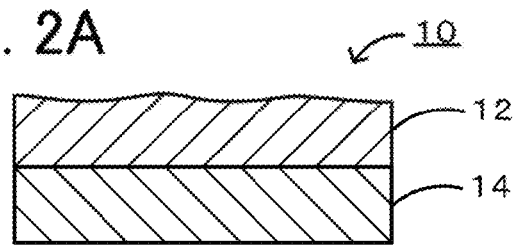
Figure 2A:
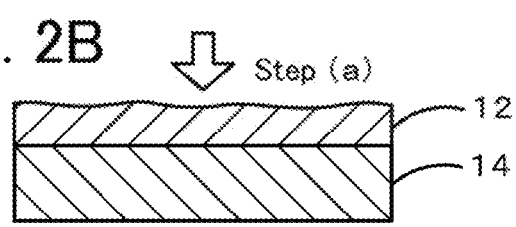
Figure 2A:
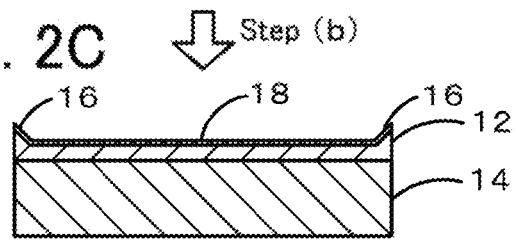
Figure 2A:
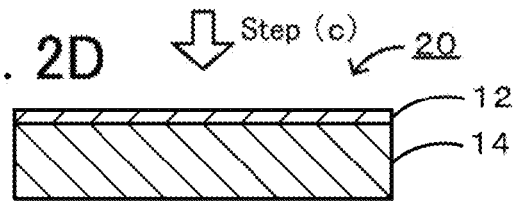

In Step (a), a laminated substrate 10 having a diameter of 2 inches or more and formed by bonding a piezoelectric substrate 12 and a support substrate 14 is used (FIG. 2A). Examples of the material of the piezoelectric substrate 12 include lithium tantalate, lithium niobate, a lithium niobate-lithium tantalate solid solution single crystal, lithium borate, langasite, and crystal. Examples of the material of the support substrate 14 include silicon, sapphire, aluminum nitride, alumina, alkali-free glass, borosilicate glass, fused quartz, lithium tantalate, lithium niobate, a lithium niobate-lithium tantalate solid solution single crystal, lithium borate, langasite, and crystal. The size of the piezoelectric substrate 12 may be such that the diameter is 2 inches or more, preferably 4 inches or more, and more preferably 4 to 8 inches and the thickness is 100 to 1000 µm, and preferably 150 to 500 µm. The size of the support substrate 14 may be such that the diameter is equal to that of the piezoelectric substrate 12 and the thickness is 100 to 1000 µm, and preferably 150 to 500 µm. While the laminated substrate 10 may include an orientation flat (OF), as illustrated in FIG. 1, it may include no OF.

The laminated substrate 10 may be obtained by bonding the piezoelectric substrate 12 and the support substrate 14 with an organic adhesive layer interposed therebetween or combining the piezoelectric substrate 12 and the support substrate 14 by direct bonding. The material of the organic adhesive layer is, for example, epoxy resin or acrylic resin. Direct bonding may be performed by activating bonding surfaces of the piezoelectric substrate and the support substrate and then pressing the substrates against each other with the bonding surfaces being opposed to each other. The bonding surfaces may be activated, for example, by being irradiated with an ion beam of an inert gas (such as argon) or being irradiated with plasma or a neutral atom beam.

In Step (a), a piezoelectric substrate 12 side of the laminated substrate 10 having a diameter of 2 inches or more and obtained by bonding the piezoelectric substrate 12 and the support substrate 14 is mirror-polished until the thickness of the piezoelectric substrate 12 reaches 20 µm or less (FIG. 2B). The thickness of the piezoelectric substrate 12 is set at 20 µm or less to achieve good filter characteristics (for example, to improve temperature characteristics). This thickness is preferably 0.1 µm or more and 20 µm or less, more preferably 0.5 µm or more and 15 µm or less, and still more preferably 0.5 µm or more and 5 µm or less. The lower limit value of the thickness can be set in consideration of accuracy of mechanical machining and suppression of deterioration of the filter characteristics due to reflection of a bulk wave at a bonding interface. The thickness is preferably 0.1 µm or more because this can achieve a relatively high thickness accuracy and can suppress deterioration of the filter characteristics due to reflection of the bulk wave. The thickness is more preferably 0.5 µm or more because this can achieve a sufficient thickness accuracy and can sufficiently suppress deterioration of the filter characteristics due to reflection of the bulk wave.

In Step (a), for example, the piezoelectric-substrate 12 side of the laminated substrate 10 may be first polished with a grinder, may be then polished with a lapping machine, and may further be mirror-polished with a CMP machine until the thickness of the piezoelectric substrate 12 reaches 20 µm or less. This can efficiently reduce the thickness of the piezoelectric substrate 12 to 20 µm or less. Here, the term CMP is an abbreviation of chemical mechanical polishing.

In Step (a), for example, a typical CMP machine 30 illustrated in FIG. 3 may be used as the CMP machine. The CMP machine 30 includes a disc-shaped polishing platen 32 provided with a polishing pad 34 and having a large diameter, a disc-shaped substrate carrier 36 having a small diameter, a pipe 38 that supplies slurry containing abrasive grains to the polishing pad 34, and a conditioner 40 that conditions the polishing pad 34. The polishing platen 32 includes a shaft and a driving motor, which are not illustrated, in the center of a lower surface thereof, and axially rotates (rotates) along with rotational driving of the shaft by the driving motor. The substrate carrier 36 and the conditioner 40 have their respective shafts in the centers of upper surfaces thereof, and axially rotate (rotate) along with rotational driving of the shafts by unillustrated driving motors. The substrate carrier 36 is disposed at a position deviating from the center of the polishing platen 32. To polish the laminated substrate 10 with the CMP machine 30, the laminated substrate 10 is loaded on a lower surface of the substrate carrier 36 with its piezoelectric substrate 12 side facing downward, and the laminated substrate 10 is held between the polishing pad 34 of the polishing platen 32 and the substrate carrier 36. Then, slurry containing abrasive grains is supplied from the pipe 38 onto the polishing pad 34. Thus, the slurry is supplied between the laminated substrate 10 and the polishing pad 24 of the polishing platen 32. In this state, CMP is performed by rotating the polishing platen 32 and the substrate carrier 36 while pressing the laminated substrate 10 against the polishing pad 34 by the substrate carrier 36.

2. Step (b)

In Step (b), the surface of the piezoelectric substrate 12 is subjected to ion beam machining so that the thickness of an outer peripheral portion 16 of the piezoelectric substrate 12 is larger than that of an inner peripheral portion (an area on an inner side of the outer peripheral portion 16) and the difference between the largest thickness and the smallest thickness of the piezoelectric substrate 12 becomes 100 nm or less over the entire surface (FIG. 2C).

The description that the thickness of the outer peripheral portion 16 of the piezoelectric substrate 12 is larger than that of the inner peripheral portion means that the thickness of the outer peripheral portion 16 is larger than that of the inner peripheral portion when the thickness of the piezoelectric substrate 12 is measured along an arbitrary straight line (also referred to as a measurement line) passing through the center O of the piezoelectric substrate 12 (when the piezoelectric substrate 12 is shaped like a circle, the center O is the center of the circle, or when the OF is provided, the center O is the center of the circle that is assumed to have no OF). For example, a range corresponding to 60% to 100% of the outer diameter of the piezoelectric substrate 12 (preferably 80% to 100%) may be referred to as the outer peripheral portion 16, a range on the inner side of the outer peripheral portion 16 may be referred to as the inner peripheral portion, and the thickness of the outer peripheral portion 16 in the entire range may be larger than that of any part of the inner peripheral portion on the measurement line. Alternatively, for example, a range within 20 mm from the outermost periphery of the piezoelectric substrate 12 (preferably 10 mm from the outermost periphery) may be referred to as the outer peripheral portion 16, a range on the inner side of the outer peripheral portion 16 may be referred to as the inner peripheral portion, and the thickness of the outer peripheral portion 16 in the entire range may be larger than that of any part of the inner peripheral portion on the measurement line. While the difference between the largest thickness and the smallest thickness of the inner peripheral portion of the piezoelectric substrate 12 may be 100 nm or less over the entire surface, it is preferably 50 nm or less, and more preferably 20 nm or less. The average value (or the center value) of the thickness of the outer peripheral portion 16 is preferably greater by 10 to 50 nm than the average value (or the center value) of the thickness of the inner peripheral portion.

In Step (b), it is preferable to perform machining so that the thickness increases toward the outermost periphery in the range corresponding to 90% to 100% of the outer diameter of the piezoelectric substrate 12 (or in the range within 5 mm from the outermost periphery). It is more preferable to perform machining so that the thickness increases toward the outermost periphery in the range corresponding to 80% to 100% of the outer diameter (or in the range within 10 mm from the outermost periphery), and it is still more preferable to perform machining so that the thickness increases toward the outermost periphery in the range corresponding to 60% to 100% of the outer diameter (or in the range within 20 mm from the outermost periphery). For example, the increase rate of the thickness in the above ranges may be 0.5 nm/mm or more and 10 nm/mm or less, preferably 1 nm/mm or more and 5 nm/mm or less, and more preferably 2 nm/mm or more and 4 nm/mm or less. The description that the thickness increases toward the outermost periphery includes not only a case in which the thickness increases at a constant increase rate, but also a case in which the thickness increases while changing the increase rate, for example, a case in which the thickness increases in such a tendency that the increase rate increases or decreases toward the outermost periphery. The increase rate of the thickness may be the average value of the changing increase rate. In Step (b), for example, machining may be performed so that the thickness of the outer peripheral portion 16 is constant and equal to the thickness on the outermost periphery. In Step (b), machining may be performed so that the thickness of the piezoelectric substrate 12 on the outermost periphery is larger by 20 nm or more, preferably by 30 nm, and more preferably by 40 nm or more than that of the thinnest portion.

In Step (b), data on a thickness distribution of the piezoelectric substrate 12 mirror-polished prior to ion beam machining may be created, and ion beam machining may be performed on the basis of the data on the thickness distribution of the mirror-polished piezoelectric substrate 12. The data on the thickness distribution of the mirror-polished piezoelectric substrate 12 may be created by measuring the thickness of the mirror-polished piezoelectric substrate 12 with an optical thickness meter using laser interferometry. This enables creation of accurate data on the thickness distribution.

In Step (b), data on a thickness difference distribution may be created by using the data on the thickness distribution of the mirror-polished piezoelectric substrate 12 and data on a thickness distribution of the piezoelectric substrate 12 desired after ion beam machining, and ion beam machining may be performed on the basis of the data on the thickness difference distribution. In Step (b), the beam irradiation time at each point on the surface of the piezoelectric substrate 12 may be determined by inputting the data on the thickness distribution of the mirror-polished piezoelectric substrate 12 or the above-described data on the thickness difference distribution to an ion beam machine, and machining may be performed using the beam irradiation time. This enables precise machining. In this case, the beam output value is fixed, and the beam irradiation time is increased as the above-described thickness difference increases. Alternatively, in Step (b), the beam output value at each point on the surface of the piezoelectric substrate 12 may be determined by inputting the data on the thickness distribution of the mirror-polished piezoelectric substrate 12 or the above-described data on the thickness difference distribution to the ion beam machine, and machining may be performed using the beam output value. This also enables precise machining. In this case, the beam irradiation time is fixed, and the beam output value is increased as the above-described thickness difference increases.

In Step (b), ion beam machining is preferably performed using an ion beam machine equipped with a DC-excited Ar beam source. As the ion beam machine, an ion beam machine equipped with a plasma-excited Ar beam source may be used, but the ion beam machine equipped with the DC-excited Ar beam source is more preferably used because an altered layer 18 formed on the surface of the piezoelectric substrate 12 is further reduced.

In the laminated substrate 10 obtained in Step (b), for example, the thickness of the piezoelectric substrate 12 may be 20 μm or less, the difference between the largest thickness and the smallest thickness may be 100 nm or less over the entire surface including the outer peripheral portion 16, and the piezoelectric substrate 12 may have such crystallinity that the full width at a half maximum of a rocking curve obtained by X-ray diffraction is 100 arcsec or less. Such a laminated substrate 10 includes a piezoelectric single-crystal thin film (piezoelectric substrate 12) having high crystallinity, an arbitrary crystal axis, and a uniform thickness, and can be suitably used for, for example, an elastic wave device after Step (c).

3. Step (c)

In Step (c), a polishing pad having a diameter of 5 mm or more and 30 mm or less is used, and CMP is performed by rotating and moving the polishing pad relative to the piezoelectric substrate 12 to be polished while maintaining a constant pressing force of the polishing pad, whereby at least a part of the altered layer 18 formed by the ion beam machining is removed and the entire surface of the piezoelectric substrate 12 is flattened (the difference in thickness between the outer peripheral portion 16 and the inner peripheral portion is reduced) (FIG. 2D).

In Step (c), the polishing pad may be moved relative to the piezoelectric substrate 12 in such a tendency that the retention time in the outer peripheral portion 16 (when the center of the polishing pad is located in the outer peripheral portion 16) is shorter than in the inner peripheral portion. In the outer peripheral portion 16, stress is likely to concentrate when the outer peripheral portion 16 is in contact with the polishing pad, and the polishing amount per unit time is greater than in the inner peripheral portion. Hence, polishing can be sufficiently performed even when the retention time of the polishing pad in the thick outer peripheral portion is short. Further, since the retention time of the polishing pad in the outer peripheral portion 16 is shorter than in the inner peripheral portion, for example, sagging due to CMP rarely occurs. In Step (c), the polishing pad may be moved relative to the piezoelectric substrate 12 in such a tendency that the retention time decreases as the thickness of the piezoelectric substrate 12 decreases. This can make the thickness of the piezoelectric substrate 12 more uniform. In Step (c), the polishing pad may be moved relative to the piezoelectric substrate 12 in such a tendency that the retention time in the outer peripheral portion 16 is shorter than in the inner peripheral portion and such a tendency that the retention time decreases as the thickness of the piezoelectric substrate 12 decreases. In this case, the polishing pad may be moved relative to the piezoelectric substrate 12 so that the retention time in the outer peripheral portion 16 is shorter than the retention time corresponding to the thickness. This can make the thickness of the piezoelectric substrate 12 more uniform and can further suppress sagging due to CMP.

In Step (c), data on the thickness distribution of the piezoelectric substrate 12 subjected to ion beam machining may be created prior to removal of the altered layer 18, and the retention time of the polishing pad may be changed on the basis of the data on the thickness distribution of the piezoelectric substrate 12 subjected to ion beam machining. The data on the thickness distribution of the piezoelectric substrate 12 subjected to ion beam machining may be created by measuring the thickness of the piezoelectric substrate 12 subjected to ion beam machining with a thickness meter, such as an optical thickness meter, using laser interferometry. In Step (c), the retention time of the polishing pad at each portion on the surface of the piezoelectric substrate 12 may be determined by inputting the data on the thickness distribution of the piezoelectric substrate 12 subjected to ion beam machining to the CMP machine, and CMP may be performed using the retention time.

In Step (c), for example, the retention time may be determined as follows. First, the thickness distribution of the piezoelectric substrate 12 subjected to ion beam machining is measured with the thickness meter such as an optical thickness meter, a thickness $Zn$ of the piezoelectric substrate 12 at $(Xn, Yn)$ coordinates is output as $(Xn, Yn, Zn)$ data (n is a natural number). From this data, a moving speed $F(Xn, Yn)$ of the center of the polishing pad at the $(Xn, Yn)$ coordinates of the piezoelectric substrate 12 is found according to relational expression $F(Xn, Yn)=K \cdot f/Zn$ (Expression (1)), and a retention time ($=\alpha/F(Xn,Yn)$) is determined. In the above Expressions, $K$ and $\alpha$ are coefficients, and $f$ represents the reference moving speed. These values may be experimentally found.

In Step (c), as the machine used for CMP, for example, a small-diameter tool CMP machine 50 illustrated in FIGS. 4 and 5 may be used. The small-diameter tool CMP machine 50 includes a disc-shaped head 56 having a small diameter and provided with a polishing pad 54, a disc-shaped stage 52 having a large diameter, and a pipe 58 that supplies slurry containing abrasive grains to the polishing pad 54. The stage 52 includes an unillustrated driving part, and moves in the horizontal plane (X-axis and Y-axis directions). The head 56 has a shaft in the center of an upper surface thereof, and is axially rotated (rotated) along with rotational driving of the shaft by an unillustrated driving motor. The shaft of the head 56 is attached to a support 60 fixed to a driving part 62 movable in the vertical direction with an unillustrated fixing part interposed therebetween, and moves in the vertical direction (Z-axis direction). The driving part 62, the driving part of the stage 52, the driving part of the head 56, and so on are connected to an unillustrated control unit, and are controlled to rotate and move the polishing pad 54 relative to the piezoelectric substrate 12 to be polished while maintaining a constant pressing force of the polishing pad 54.

To polish the laminated substrate 10 with the small-diameter tool CMP machine 50, the laminated substrate 10 is loaded on an upper surface of the stage 52 with its piezoelectric substrate 12 side facing upward, and the laminated substrate 10 is held between the stage 52 and the polishing pad 54. Then, slurry containing abrasive grains is supplied from the pipe 58 to the polishing pad 54. Thus, the slurry is supplied between the laminated substrate 10 and the polishing pad 54. The polishing pad 54 is moved relative to the piezoelectric substrate 12 by moving the stage 52 in the horizontal direction in this state, and the pressing force of the polishing pad 54 is kept constant by controlling the upward and downward movements of the driving part 62. The laminated substrate 10 is subjected to CMP while rotating the polishing pad 54. At this time, for example, the polishing pad 54 and the piezoelectric substrate 12 may be moved relative to each other so that the center of the polishing pad 54 moves on the piezoelectric substrate 12 in a zigzag form (see a route P in FIG. 4) or moves in a spiral form.

During polishing with the small-diameter tool CMP machine 50, the pressing force applied to the polishing pad 54 is measured with a load measuring unit 70 (for example, a load cell or a dynamometer) disposed between the support 60 and the driving part 62, and the measured value is input to the above-described control unit. The control unit controls upward and downward movements of the driving part 62 on the basis of the input measured value. In this way, the pressing force of the polishing pad 54 can be kept constant. While the polishing pad 54 is moved relative to the piezoelectric substrate 12 by movement of the piezoelectric substrate 12 in the small-diameter tool CMP machine 50, it may be moved relative to the piezoelectric substrate 12 by its own movement. Further, while the polishing pad 54 moves in the vertical direction, the piezoelectric substrate 12 may move in the vertical direction.

In Step (c), CMP may be performed so that the thickness of the piezoelectric substrate 12 is 20 μm or less, and preferably 0.1 μm or more and 10 μm or less and the difference between the largest thickness and the smallest thickness is 100 nm or less, preferably 50 nm or less, and more preferably 10 nm or more and 20 nm or less over the entire surface including the outer peripheral portion 16. In Step (c), CMP may be performed so that the thickness of the altered layer 18 is 3 nm or less, preferably 2 nm or less, and more preferably 1 nm or less.

Warpage of an obtained composite substrate 20 is preferably 100 μn or less, more preferably 50 μm or less, and still more preferably 10 μm or less.

In the above-described production method for the composite substrate according to the embodiment, since at least a part of the altered layer 18 resulting from ion beam machining is removed, it is possible to provide a composite substrate in which the altered layer 18 is further reduced. At this time, small-diameter tool CMP is conducted on the laminated substrate 10, which is subjected to ion beam machining so that the thickness of the outer peripheral portion 16 in the piezoelectric substrate 12 is large, under appropriate conditions. Hence, for example, sagging due to small-diameter tool CMP rarely occurs. Also, when machining is performed so that the thickness of the outer peripheral portion 16 in the piezoelectric substrate 12 is larger than in the inner peripheral portion, it can be more precisely performed by adopting ion beam machining. This can make the thickness distribution of the piezoelectric substrate 12 more adequate.

The composite substrate produced by the production method for the composite substrate according to the present invention can be used, for example, as an elastic wave device by forming an electrode pattern on the surface of the piezoelectric substrate.

It is needless to say that the present invention is not limited to the above-described embodiment and can be carried out in various embodiments as long as they belong to the technical scope of the invention. For example, while the surface of the piezoelectric substrate 12 is machined using the ion beam in Step (b) of the above-described embodiment, it may be machined using a neutral atom beam (such as an Ar neutral atom beam) instead of the ion beam. This can also obtain advantages similar to those of the above-described embodiment.

EXAMPLES

Cases in which the production method for the composite substrate according to the present invention was carried out will be described below as examples. The present invention is not limited to the following examples.

Example 1

A silicon substrate (support substrate) and a $LiNbO_3$ substrate (piezoelectric substrate), each of which was polished on both surfaces and had a thickness of 230 μm and a diameter of 2 inches, were prepared. These substrates were introduced into a vacuum chamber maintaining a vacuum degree on the order of $10^{-6}$ Pa, and were held with their bonding surfaces being opposed to each other. The bonding surfaces of the substrates were irradiated with an Ar beam for 80 seconds to remove inactive layers and to activate the surfaces. Next, the substrates were set in contact with each other, and were bonded together under a load of 1200 kgf. After a laminated substrate thus obtained was taken out, a piezoelectric-substrate side thereof was ground with a grinder until the thickness reached 10 μm. Next, the laminated substrate was set on a lapping machine, and was polished through the use of a diamond slurry until the thickness of the piezoelectric substrate reached 3 μm. Further, the surface of the piezoelectric substrate was mirror-polished with a CMP machine until the thickness reached 0.8 μm. At this time, colloidal silica was used as the abrasive (Step (a)).

The thickness of the piezoelectric substrate was measured with an optical thickness meter using laser interferometry. As a result, the thickness was within the range of 0.8 μm±0.1 μm over the entire surface of the piezoelectric substrate including an outer peripheral portion. The measurement was made at a total of 80 points over the entire surface of the piezoelectric substrate except for chamfered edges.

The laminated substrate thus obtained was set on an ion beam machine equipped with a plasma-excited Ar beam source. Next, data on a thickness distribution of the mirror-polished piezoelectric substrate measured with the above-described optical thickness meter and data on a thickness distribution desired after ion beam machining (the thickness of the outer peripheral portion was greater than that of the inner peripheral portion) were imported into the ion beam machine to create data on a thickness difference distribution. By using the data on the thickness difference distribution, the machining amounts at respective measurement points in the piezoelectric substrate, here, the lengths of the irradiation time with the Ar beam, were determined. The beam irradiation time was adjusted by the feeding speed of the laminated substrate. While changing the feeding speed of the laminated substrate, the entire surface of the piezoelectric substrate was irradiated with the Ar beam at a constant output. The beam spot was 6 mm in diameter. RF plasma was excited under fixed conditions where the ion accelerating voltage was 1300 eV and the ion current was 30 mA. The actual machining time was about 5 minutes (Step (b)).

The thickness of the piezoelectric substrate in the machined laminated substrate was measured again. As a result, the center thickness was 450 nm, and the difference between the largest thickness and the smallest thickness was 65 nm over the entire surface including the outer peripheral portion. When a rocking curve was measured with an X-ray diffractometer, the full width at a half maximum (FWHM) thereof was 80 arcsec, and this was equal to that of the bulk single crystal.

The laminated substrate thus obtained was set in the small-diameter tool CMP machine 50 illustrated in FIGS. 4 and 5. Next, data on the thickness distribution of the piezoelectric substrate, which was subjected to ion beam machining, measured with the above-described optical thickness meter, was imported to the small-diameter tool CMP machine 50, and the retention time of the polishing pad 54 was determined according to Expression (1) described above. Then, small-diameter tool CMP was performed by operating the small-diameter tool CMP machine 50 using this retention time (Step (c)). In this way, a composite substrate of Example 1 was obtained.

Figure 6:
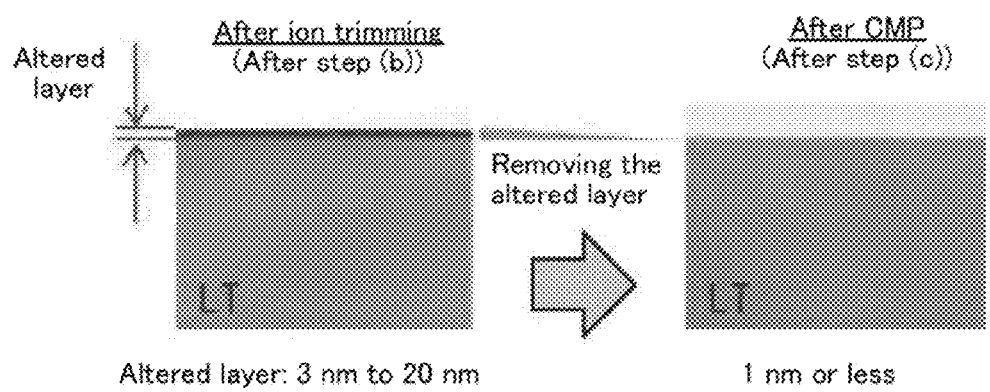
FIG. 6 shows TEM photographs of the cross section before and after Step (c).

Before and after Step (c), a cross section of the piezoelectric substrate near the surface was observed with a TEM. FIG. 6 shows TEM photographs of the cross section before and after Step (c). Before Step (c), an altered layer was found on the surface. The thickness of the altered layer (a black layer on the surface) was 5 nm. In contrast, the altered layer was not found after Step (c).

Figure 7:
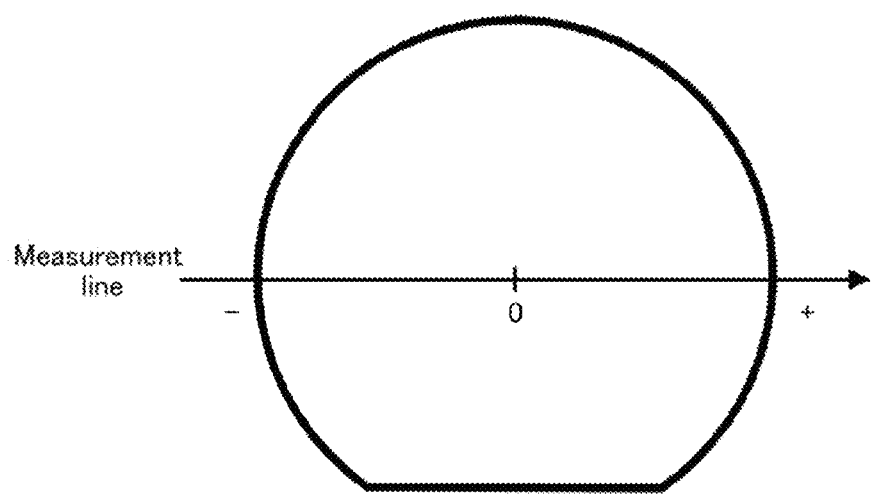
FIG. 7 is a measurement line of a piezoelectric substrate.
Figure 8A:
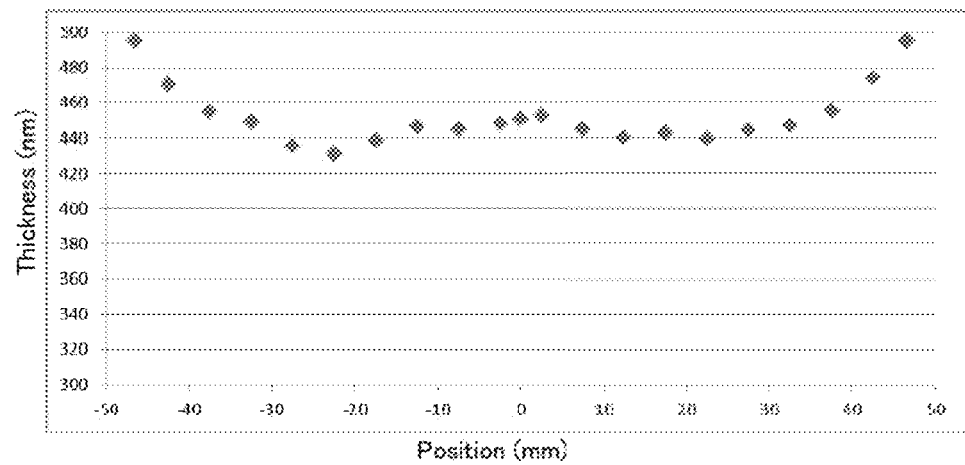
FIGS. 8A and 8B show thickness distributions of the piezoelectric substrate before and after Step (c) in Example 1.
Figure 8B:
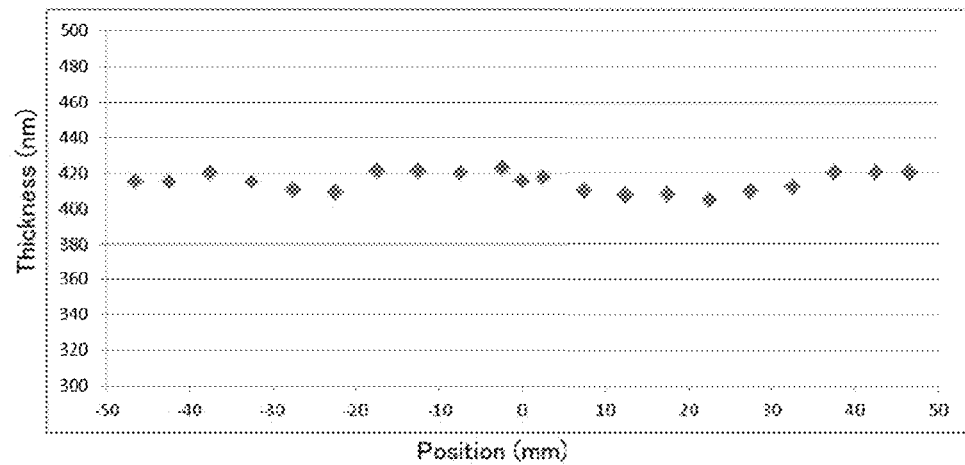

Before and after Step (c), the thickness distribution of the piezoelectric substrate of the laminated substrate on a measurement line illustrated in FIG. 7 was measured. FIGS. 8A and 88B show thickness distributions of the piezoelectric substrate before and after Step (c) in Example 1. FIG. 8A shows the thickness distribution before Step (c), and FIG. 8B shows the thickness distribution after Step (c). In Example 1, sagging in the outer peripheral portion was not confirmed after Step (c), as shown in FIG. 8B.

Warpage (SORI) of the composite substrate of Example 1 (after Step (c)) was measured in conformity with the SEMI (Semiconductor Equipment and Materials International) standard. In measurement, FlatMaster manufactured by Corning Tropel Corporation was used. SORI of the composite substrate of Example 1 was 5 μm.

Example 2

A silicon substrate (support substrate) and a $LiNbO_3$ substrate (piezoelectric substrate), each of which was polished on both surfaces and had a thickness of 230 μm and a diameter of 2 inches, were prepared. These substrates were introduced into a vacuum chamber maintaining a vacuum degree on the order of $10^{-6}$ Pa, and were held with their bonding surfaces being opposed to each other. The bonding surfaces of the substrates were irradiated with an Ar beam for 80 seconds to remove inactive layers and to activate the surfaces. Next, the substrates were set in contact with each other, and were bonded together under a load of 1200 kgf. After a laminated substrate thus obtained was taken out, a piezoelectric-substrate side thereof was ground with a grinder until the thickness reached 10 μm. Next, the laminated substrate was set on a lapping machine, and was polished through the use of a diamond slurry until the thickness of the piezoelectric thickness reached 5 μm. Further, the surface of the piezoelectric substrate was mirror-polished with a CMP machine until the thickness reached 2.5 µm. At this time, colloidal silica was used as the abrasive (Step (a)).

The thickness of the piezoelectric substrate was measured with an optical thickness meter using laser interferometry. As a result, the thickness was within the range of 2.5 µm±0.1 µm over the entire surface of the piezoelectric substrate including the outer peripheral portion. The measurement was made at a total of 80 points over the entire surface of the piezoelectric substrate except for chamfered edges.

The laminated substrate thus obtained was set on an ion beam machine equipped with a plasma-excited Ar beam source. Next, data on a thickness distribution of the mirror-polished piezoelectric substrate measured with the above-described optical thickness meter and data on a thickness distribution desired after ion beam machining (the thickness of the outer peripheral portion was greater than that of the inner peripheral portion) were imported into the ion beam machine to create data on a thickness difference distribution. By using the data on the thickness difference distribution, the machining amounts at respective measurement points in the piezoelectric substrate, here, the lengths of the irradiation time with the Ar beam, were determined. The beam irradiation time was adjusted by the feeding speed of the laminated substrate. While changing the feeding speed of the laminated substrate, the entire surface of the piezoelectric substrate was irradiated with the Ar beam at a constant output. The beam spot was 6 mm in diameter. RF plasma was excited under fixed conditions where the ion accelerating voltage was 1300 eV and the ion current was 30 mA. The actual machining time was about 5 minutes (Step (b)).

The thickness of the piezoelectric substrate in the machined laminated substrate was measured again. As a result, the center thickness was 1910 nm, and the difference between the largest thickness and the smallest thickness was 40 nm over the entire surface including the outer peripheral portion. When a rocking curve was measured with an X-ray diffractometer, the full width at a half maximum (FWHM) thereof was 80 arcsec, and this was equal to that of the bulk single crystal.

The laminated substrate thus obtained was set in the small-diameter tool CMP machine 50 illustrated in FIGS. 4 and 5. Next, data on the thickness distribution of the piezoelectric substrate, which was subjected to ion beam machining, measured with the above-described optical thickness meter was imported to the small-diameter tool CMP machine 50, and the retention time of the polishing pad 54 was determined according to Expression (1) described above. Then, small-diameter tool CMP was performed by operating the small-diameter tool CMP machine 50 using this retention time (Step (c)). In this way, a composite substrate of Example 2 was obtained.

Figure 9A:
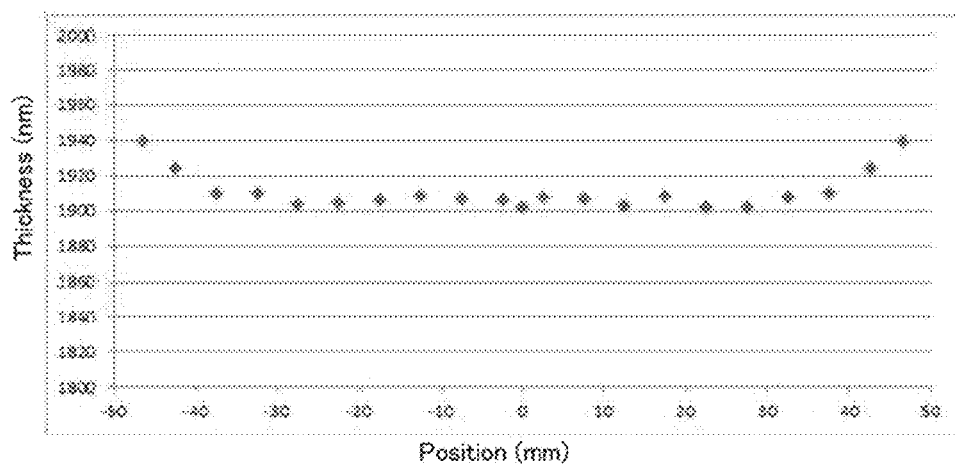
FIGS. 9A and 9B show thickness distributions of the piezoelectric substrate before and after Step (c) in Example 2.
Figure 9B:
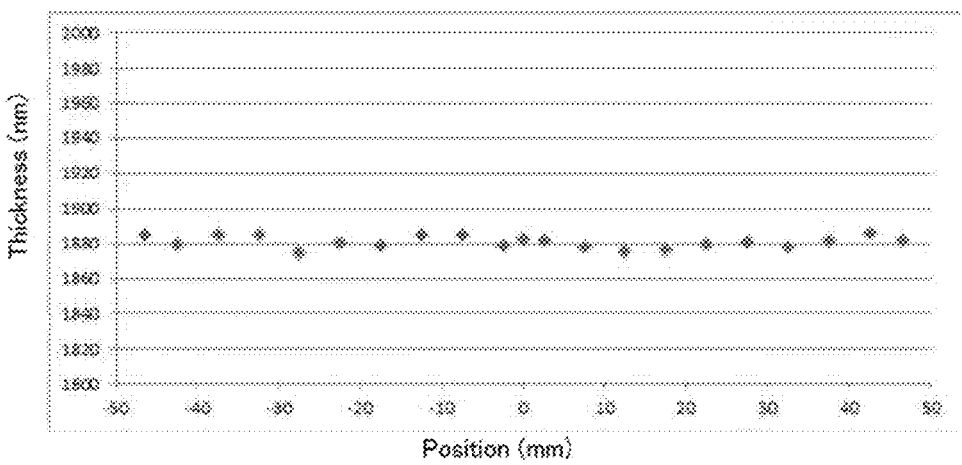

Before and after Step (c), a thickness distribution of the piezoelectric substrate of the laminated substrate on the measurement line illustrated in FIG. 7 was measured. FIGS. 9A and 9B show thickness distributions of the piezoelectric substrate before and after Step (c) in Example 1. FIG. 9A shows the thickness distribution before Step (c), and FIG. 9B shows the thickness distribution after Step (c). In Example 2, sagging in the outer peripheral portion was not confirmed after Step (c), as shown in FIG. 9B.

Example 3

A silicon substrate (support substrate) and a $LiNbO_3$ substrate (piezoelectric substrate), each of which was polished on both surfaces and had a thickness of 230 µm and a diameter of 2 inches, were prepared. These substrates were introduced into a vacuum chamber maintaining a vacuum degree on the order of $10^{-6}$ Pa, and were held with their bonding surfaces being opposed to each other. The bonding surfaces of the substrates were irradiated with an Ar beam for 80 seconds to remove inactive layers and to activate the surfaces. Next, the substrates were set in contact with each other, and were bonded together under a load of 1200 kgf. After a laminated substrate thus obtained was taken out, a piezoelectric-substrate side thereof was ground with a grinder until the thickness reached 10 µm. Next, the laminated substrate was set on a lapping machine, and was polished through the use of a diamond slurry until the thickness of the piezoelectric thickness reached 4 µm. Further, the surface of the piezoelectric substrate was mirror-polished with a CMP machine until the thickness reached 1.8 µm. At this time, colloidal silica was used as the abrasive (Step (a)).

The thickness of the piezoelectric substrate was measured with an optical thickness meter using laser interferometry. As a result, the thickness was within the range of 1.8 µm±0.1 µm over the entire surface of the piezoelectric substrate including the outer peripheral portion. The measurement was made at a total of 80 points over the entire surface of the piezoelectric substrate except for chamfered edges.

The laminated substrate thus obtained was set on an ion beam machine equipped with a plasma-excited Ar beam source. Next, data on a thickness distribution of the mirror-polished piezoelectric substrate measured with the above-described optical thickness meter and data on a thickness distribution desired after ion beam machining (the thickness of the outer peripheral portion was greater than that of the inner peripheral portion) were imported into the ion beam machine to create data on a thickness difference distribution. By using the data on the thickness difference distribution, the machining amounts at respective measurement points in the piezoelectric substrate, here, the lengths of the irradiation time with the Ar beam, were determined. The beam irradiation time was adjusted by the feeding speed of the laminated substrate. While changing the feeding speed of the laminated substrate, the entire surface of the piezoelectric substrate was irradiated with the Ar beam at a constant output. The beam spot was 6 mm in diameter. RF plasma was excited under fixed conditions where the ion accelerating voltage was 1300 eV and the ion current was 30 mA. The actual machining time was about 5 minutes (Step (b)).

The thickness of the piezoelectric substrate in the machined laminated substrate was measured again. As a result, the center thickness was 1185 nm, and the difference between the largest thickness and the smallest thickness was 95 nm over the entire surface including the outer peripheral portion. When a rocking curve was measured with an X-ray diffractometer, the full width at a half maximum (FWHM) thereof was 80 arcsec, and this was equal to that of the bulk single crystal.

The laminated substrate thus obtained was set in the small-diameter tool CMP machine 50 illustrated in FIGS. 4 and 5. Next, data on the thickness distribution of the piezoelectric substrate, which was subjected to ion beam machining, measured with the above-described optical thickness meter was imported to the small-diameter tool CMP machine 50, and the retention time of the polishing pad 54 was determined according to Expression (1) described above. Then, small-diameter tool CMP was performed by operating the small-diameter tool CMP machine 50 using this retention time (Step (c)). In this way, a composite substrate of Example 3 was obtained.

Figure 10A:
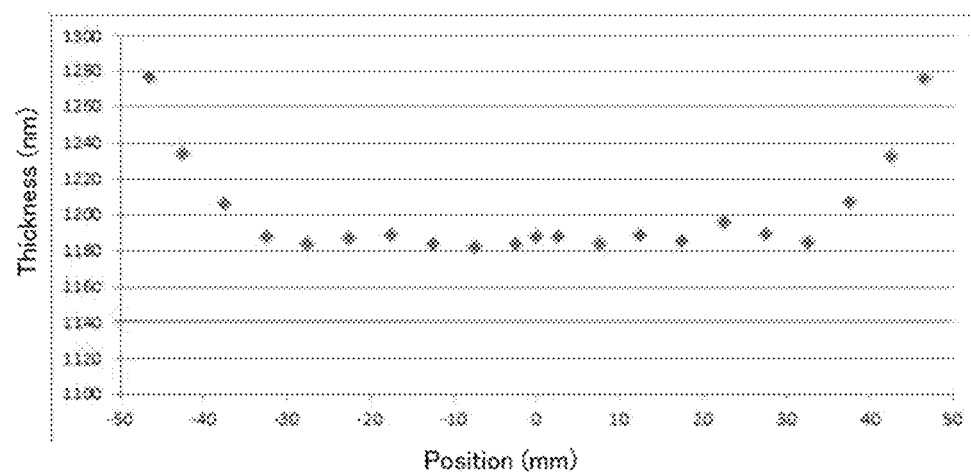
FIGS. 10A and 10B show thickness distributions of the piezoelectric substrate before and after Step (c) in Example 3.
Figure 10B:
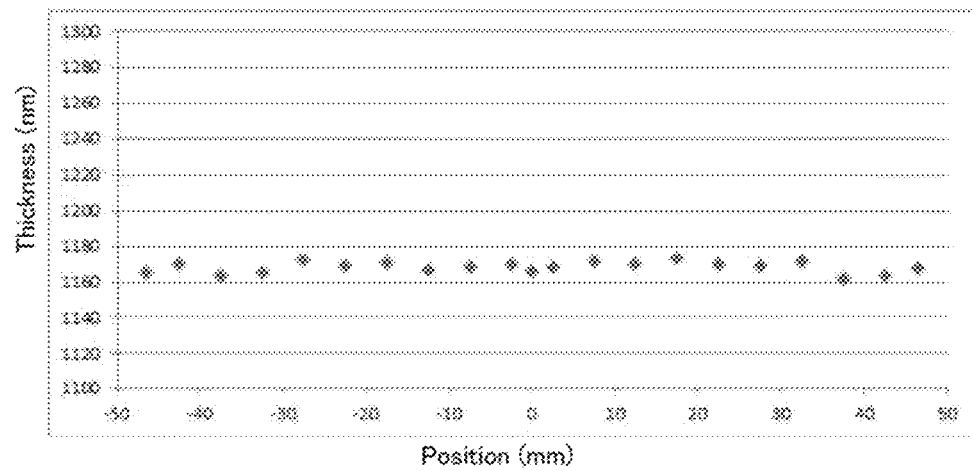

Before and after Step (c), a thickness distribution of the piezoelectric substrate of the laminated substrate on the measurement line illustrated in FIG. 7 was measured. FIGS. 10A and 10B show thickness distributions of the piezoelectric substrate before and after Step (c) in Example 1. FIG. 10A shows the thickness distribution before Step (c), and FIG. 10B shows the thickness distribution after Step (c). In Example 3, sagging in the outer peripheral portion was not confirmed after Step (c), as shown in FIG. 10B.

Comparative Example 1

A composite substrate of Comparative Example 1 was produced similarly to Example 1 except that ion beam machining was performed in Step (b) so that the thickness of an outer peripheral portion and the thickness of an inner peripheral portion were equal to each other.

The thickness of a piezoelectric substrate in a laminated substrate after Step (b) in Comparative Example 1 was measured. As a result, the center thickness was 450 nm, and the difference between the largest thickness and the smallest thickness was 100 nm over the entire surface including the outer peripheral portion. When a rocking curve was measured with an X-ray diffractometer, the full width at a half maximum (FWHM) thereof was 80 arcsec, and this was equal to that of the bulk single crystal.

Figure 11A:
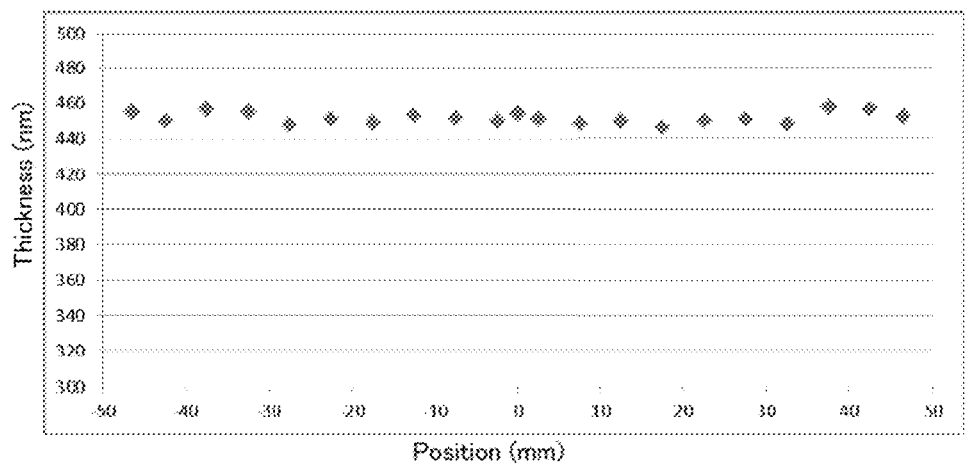
FIGS. 11A and 11B show thickness distributions of the piezoelectric substrate before and after Step (c) in Comparative Example 1.
Figure 11B:
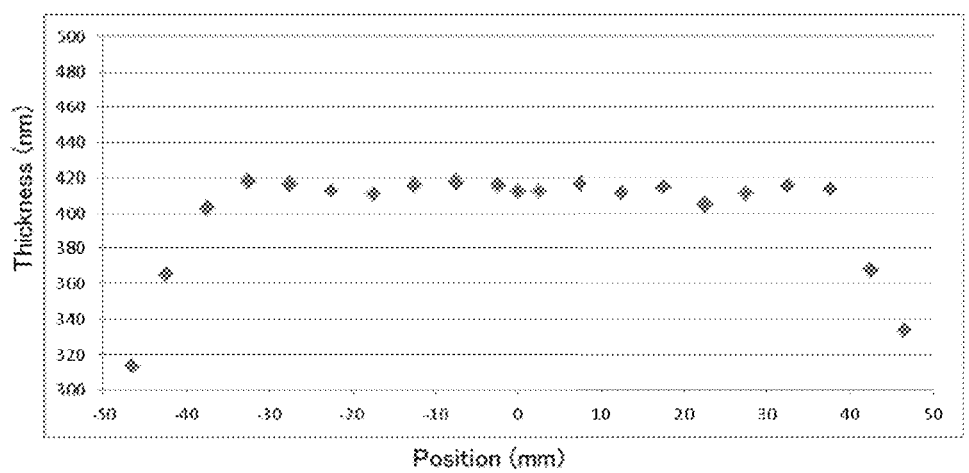

Before and after Step (c), a thickness distribution of the piezoelectric substrate of the laminated substrate on the measurement line illustrated in FIG. 7 was measured. FIGS. 11A and 11B show thickness distributions of the piezoelectric substrate before and after Step (c) in Comparative Example 1. FIG. 11A shows the thickness distribution before Step (c), and FIG. 11B shows the thickness distribution after Step (c). In Comparative Example 1, sagging occurred in the outer peripheral portion even after Step (c), as shown in FIG. 11B, and the thickness on the outermost periphery was reduced by 100 nm or more.

The present application claims priority from Japanese Patent Application No. 2015-181762, filed on Sep. 15, 2015, the entire contents of which are incorporated herein by reference.

What is claimed is:

1. A production method for a composite substrate, comprising:
   (a) a step of mirror-polishing a piezoelectric-substrate side of a laminated substrate, formed by bonding a piezoelectric substrate and a support substrate, and having a diameter of 2 inches or more, until a thickness of the piezoelectric substrate reaches 20 μm or less;
   (b) a step of performing machining using an ion beam or a neutral atom beam so that a thickness of an outer peripheral portion of the piezoelectric substrate is larger than a thickness of an inner peripheral portion, and a difference between a largest thickness and a smallest thickness of the inner peripheral portion of the piezoelectric substrate is 100 nm or less; and
   (c) a step of flattening the entire surface of the piezoelectric substrate to remove at least a part of an altered layer formed by the machining using the ion beam or the neutral atom beam in the step (b) by performing CMP using a polishing pad having a diameter of 5 mm or more and 30 mm or less and rotating and moving the polishing pad relative to the piezoelectric substrate while maintaining a constant pressing force of the polishing pad.

2. The production method for the composite substrate according to claim 1, wherein, in the step (c), the polishing pad is moved relative to the piezoelectric substrate such that a retention time thereof in the outer peripheral portion is shorter than in the inner peripheral portion.

3. The production method for the composite substrate according to claim 1, wherein, in the step (c), the polishing pad is moved relative to the piezoelectric substrate such that a retention time thereof decreases as the thickness of the piezoelectric substrate decreases.

4. The production method for the composite substrate according to claim 1, wherein, in the step (c), the polishing pad is moved relative to the piezoelectric substrate such that a retention time thereof in the outer peripheral portion is shorter than in the inner peripheral portion and such that the retention time decreases as the thickness of the piezoelectric substrate decreases in the inner peripheral portion.

5. The production method for the composite substrate according to claim 1, wherein, in the step (b), the machining using the ion beam or the neutral atom beam is performed so that an average value of the thickness of the outer peripheral portion of the piezoelectric substrate is larger by 10 to 50 nm than an average value of the thickness of the inner peripheral portion.

6. The production method for the composite substrate according to claim 1, wherein, in the step (b), the machining using the ion beam or the neutral atom beam is performed so that the thickness of the piezoelectric substrate on an outermost periphery is larger by 20 nm or more than a thickness of a thinnest portion.

7. The production method for the composite substrate according to claim 1, wherein, in the step (b), the machining using the ion beam or the neutral atom beam is performed so that the thickness of the piezoelectric substrate increases toward an outermost periphery within a range corresponding to 90% to 100% of an outer diameter of the piezoelectric substrate or in a range within 5 mm from the outermost periphery.

8. The production method for the composite substrate according to claim 7, wherein, in the step (b), the machining using the ion beam or the neutral atom beam is performed so that an increase rate of the thickness in the range is 0.5 nm/mm or more and 10 nm/mm or less.

* * * * *